United States Patent [19]

Fehrman

[11] Patent Number: 5,672,981

[45] Date of Patent: Sep. 30, 1997

[54] UNIVERSAL POWER INTERFACE ADAPTER FOR BURN-IN BOARD

[75] Inventor: Edmund P. Fehrman, Colorado Springs, Colo.

[73] Assignees: AT&T Global Information Solutions Company, Dayton, Ohio; Hyundai Electronics America, San Jose, Calif.; Symbios Logic Inc., Fort Collins, Colo.

[21] Appl. No.: 614,925

[22] Filed: Mar. 11, 1996

Related U.S. Application Data

[63] Continuation of Ser. No. 308,063, Sep. 16, 1994, abandoned.

[51] Int. Cl.[6] .................................................. G01R 31/02
[52] U.S. Cl. ................................. 324/760; 324/755
[58] Field of Search ................................. 324/754, 755, 324/760; 307/149

[56] References Cited

U.S. PATENT DOCUMENTS

| | | |
|---|---|---|
| 3,963,986 | 6/1976 | Morton et al. . |
| 4,145,620 | 3/1979 | Dice .................................. 307/149 |
| 4,417,204 | 11/1983 | Dehmel et al. . |
| 4,542,341 | 9/1985 | Santomango et al. . |
| 4,583,042 | 4/1986 | Riemer . |
| 4,668,041 | 5/1987 | La Komski . |
| 4,747,784 | 5/1988 | Cedrone . |
| 4,926,117 | 5/1990 | Nevill . |
| 4,933,635 | 6/1990 | Deutsch et al. . |
| 4,950,980 | 8/1990 | Pfaff . |
| 5,068,602 | 11/1991 | Mielke . |
| 5,101,149 | 3/1992 | Adams et al. . |
| 5,132,613 | 7/1992 | Papae et al. . |
| 5,136,471 | 8/1992 | Inasaka . |
| 5,144,228 | 9/1992 | Soma et al. . |
| 5,157,829 | 10/1992 | Schmidt et al. . |
| 5,166,605 | 11/1992 | Daum et al. . |
| 5,247,248 | 9/1993 | Fukunaga . |
| 5,258,648 | 11/1993 | Lin . |
| 5,262,719 | 11/1993 | Magdo . |
| 5,270,641 | 12/1993 | Van Loan et al. . |
| 5,367,436 | 11/1994 | Ikei .................................. 361/766 |
| 5,477,160 | 12/1995 | Love .................................. 324/755 |

*Primary Examiner*—Vinh P. Nguyen
*Assistant Examiner*—Russell M. Kobert
*Attorney, Agent, or Firm*—Wayne P. Bailey

[57] ABSTRACT

A power interface adapter that provides device power connections in a universal burn-in board system. The power interface adapter is a low-cost printed circuit board which interfaces on a one-to-one basis with each burn-in board device socket, thus providing a complete power interface connection. The power interface adapter offers a significant improvement over the present universal burn-in board power connection methods by eliminating device power related manufacturing limitations presently placed on universal burn-in board designs.

4 Claims, 5 Drawing Sheets

UNIVERSAL POWER INTERFACE ADAPTER FOR BURN-IN BOARD

This is a continuation of application Ser. No. 08/308,063 filed Sep. 16, 1994 now abandoned.

TECHNICAL FIELD

The present invention relates to test systems used for integrated circuits and electrical/electronic components, and more specifically to a power adapter for supplying power supply voltages from a burn-in board to such circuits and components.

BACKGROUND OF THE INVENTION

Burn-in testing is a common technique used after the manufacture of an integrated circuit device or higher level assembly such as a board containing multiple electrical/electronic components. The burn-in test is a combined procedure in which the devices and/or circuits are placed under environmental and electrical stress and then exercised under such stress conditions. An example would be placing an electronic board in a heating or environmental chamber, elevating the chamber to a high operating temperature, and then operating the board by applying stress level electrical power and stimulus to the board. Such systems are known in the art, as exemplified by U.S. Pat. No. 4,926,117 to Nevill, and U.S. Pat. No. 5,157,829 to Schmidt et al., both of which are hereby incorporated by reference.

For burning-in of individual integrated circuit modules, one or more IC modules are mounted in device sockets connected to a burn-in board (BIB). This BIB can then be used as a carrier to which electrical power, stimulus and response signals can be applied and monitored.

Present universal burn-in board (i.e. burn-in board with product conversion capability) design technology in the area of power interface to multiple device test sites consists of manually connecting supply voltage wiring, at each device test site on the burn-in board, from printed circuit power pads to the device socket or socket receptacle pins/pads as defined per the device specification. This power connection approach does, however, have logical limitations. The time required for the BIB manufacturer to manually install the wires needed at each socket location can significantly add to the manufacturing time and cost of the BIB. As a result, a universal design approach for a device with a high number of power pins using this method of power interface may be deemed impractical, and must be designed as a dedicated product BIB in which all power connections are made during the printed circuit manufacturing process. A dedicated BIB design, however, may also be considered impractical to the IC manufacturer when considering the high cost associated with the purchase of multiple burn-in boards that may require modification or conversion to a different product type in the future.

The method of power interface described hereafter provides the BIB manufacturer with a low-cost, high-reliability solution to customer requirements for a universal BIB design.

SUMMARY OF THE INVENTION

The power interface adapter (PIA) described herein provides a solution to the present limitations in the area of device power interface in universal burn-in board design. The power interface adapter is a low-cost printed circuit board (PCB) which interfaces on a one-to-one basis with each BIB device socket. The power interface adapter provides the device under test with a complete power interface to include device supply voltage(s), capacitor de-coupling along with additional passive and/or active component requirements as defined per the device specification.

DETAILED DESCRIPTION OF THE PREFERRED EMBODIMENT

Figure 1:
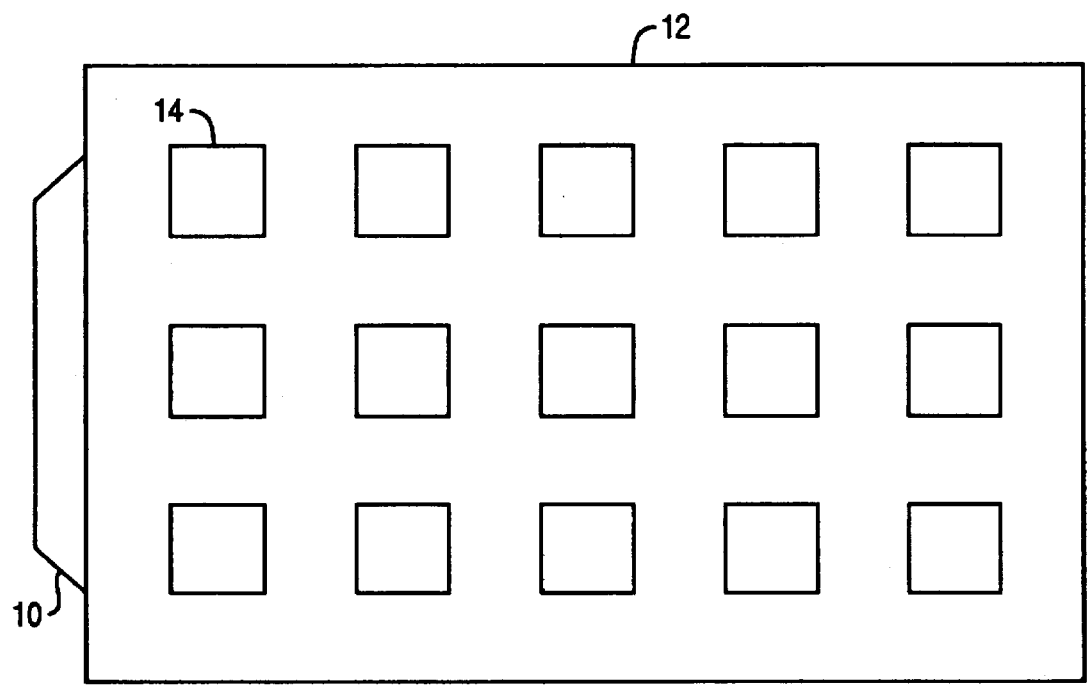
FIG. 1 is a drawing of a traditional burn-in board.

Referring initially to FIG. 1, there is shown a burn-in board 12 having a plurality of device sockets 14. The burn-in board also has an edge connector 10 which plugs into a burn-in fixture (not shown). Burn-in fixtures are well known in the art, and provide supply voltages and stimulus/response signals to the edge connector in a traditional manner. The burn-in board distributes the edge connector stimulus/response signals (i.e. operative signals) to the signal pins of the device socket 14. The burn-in board also distributes the edge connector supply voltages to power pins of the device socket 14. In numerous types of universal burn-in boards, the supply voltages from the edge connector are routed to power pads that are primarily located in the central portion of the device socket. These power pads provide a means by which to facilitate the manual interconnect of wires which extend from these power pads to the device socket pins which require power per the device specification.

Figure 2:
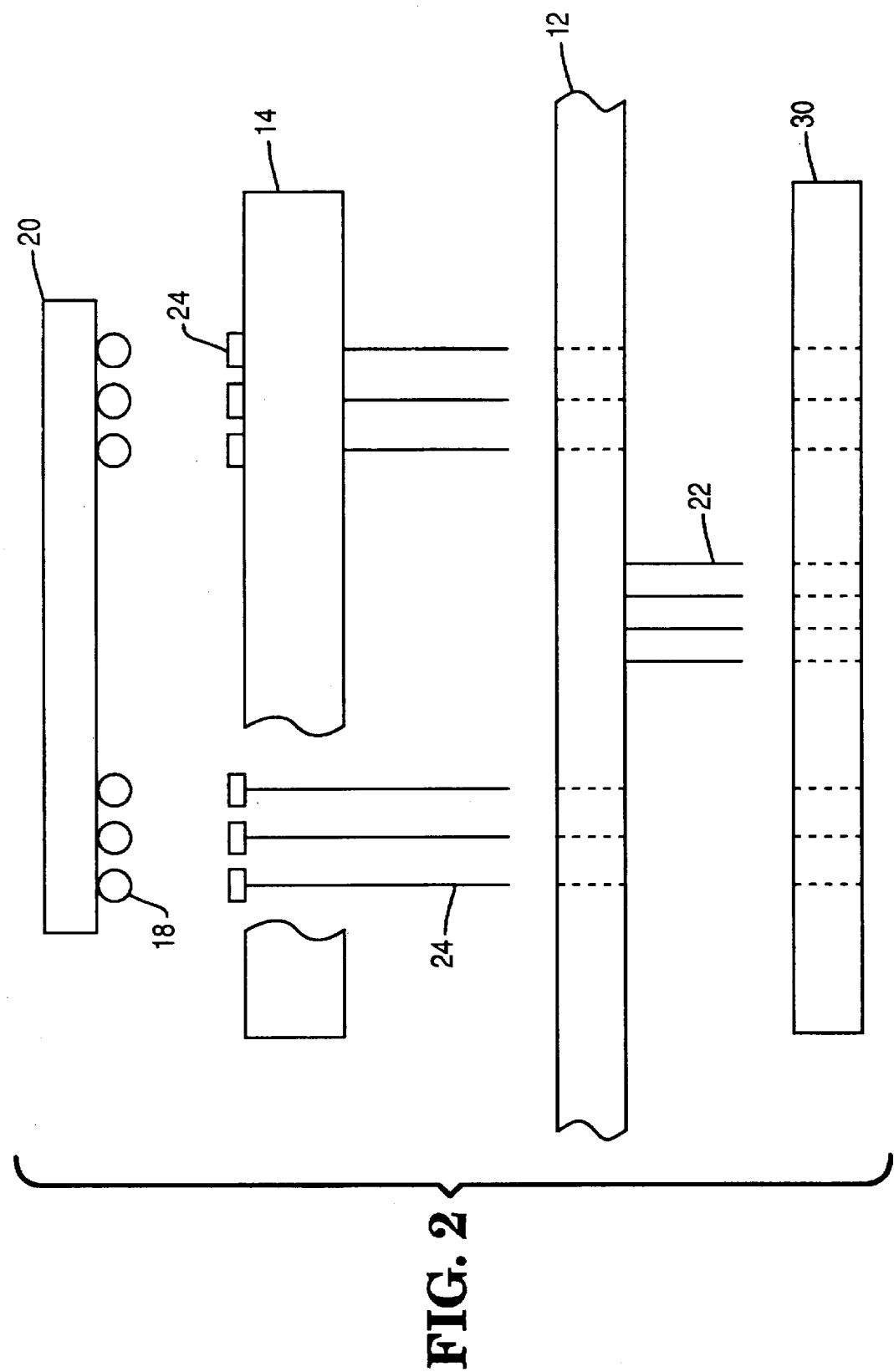
FIG. 2 shows an integrated circuit and its associated interconnect path to a power interface adapter.

A power interface adapter printed circuit board is described herein that eliminates such manual interconnect. This power interface adapter is electrically coupled to both the device socket and the burn in board. FIG. 2 shows the interconnect path for a single integrated circuit (IC) package 20 to a power interface adapter 30. The integrated circuit package 20 contains an integrated circuit die or component (not shown) which provides some type of characteristic or function which is to be tested. The integrated circuit package 20 has a plurality of conductive pins or balls 18 which contact an associated plurality of conductive device socket pins 24 on the device socket 14. These device socket pins 24 are also used to electrically connect the device socket 14 to the burn-in board 12 and the power interface adapter 30. The burn-in board 12 has a plurality of conductive power interconnect pins 22 which are used to electrically connect the burn-in board 12 to the power interface adapter 30. These power interconnect pins 22 are used for transferring supply voltages from the burn-in board (as supplied by the burn-in fixture) to the power interface adapter 30. The power interface adapter 30 then distributes these supply voltages to the required device socket pins 24 of the device socket 14 per the device specification. The device socket pins 24 of the device socket 14 are used to pass both supply voltages from the power interface adapter 30 and stimulus/response signals from the burn-in board 14 to the integrated circuit package 20.

Figure 3:
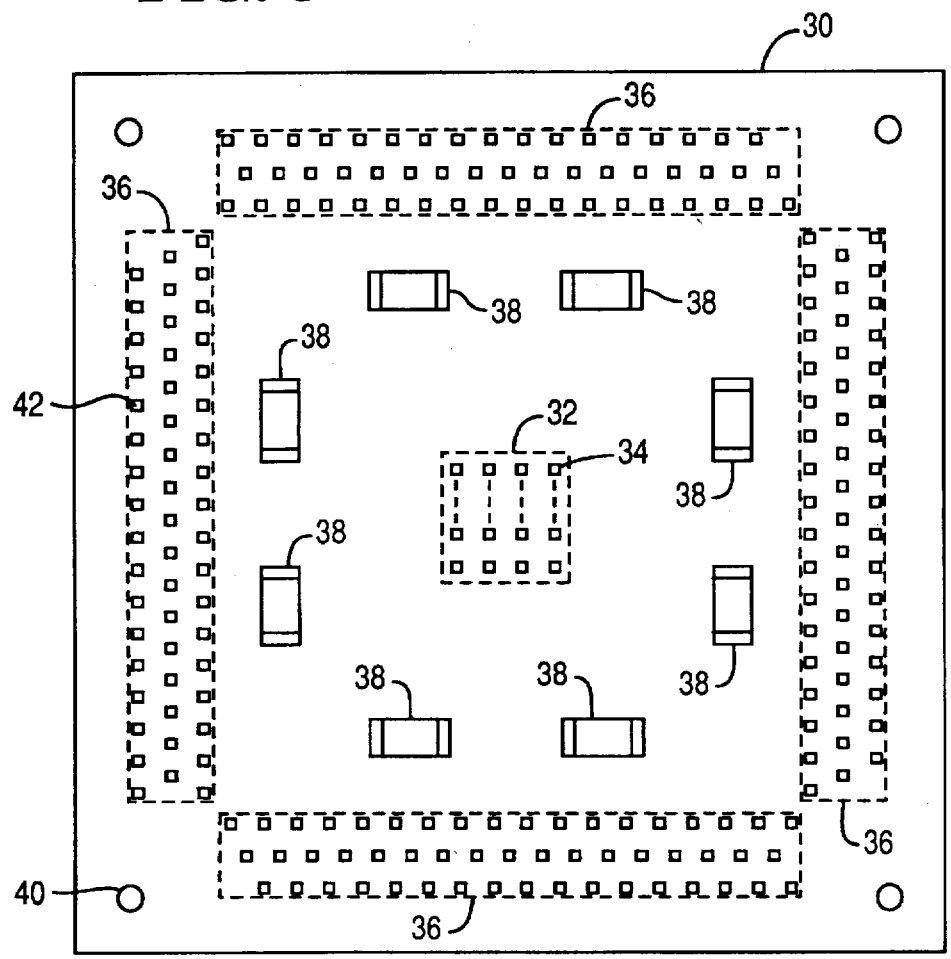
FIG. 3 shows a power interface adapter.
Figure 4:
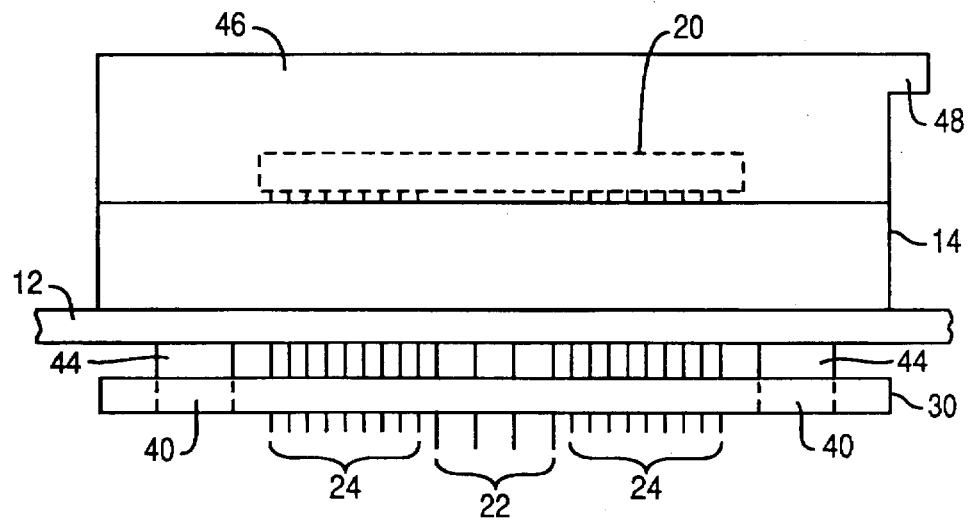
FIG. 4 shows a completed burn-in board assembly for a single socket location containing a power interface adapter.
Figure 5:
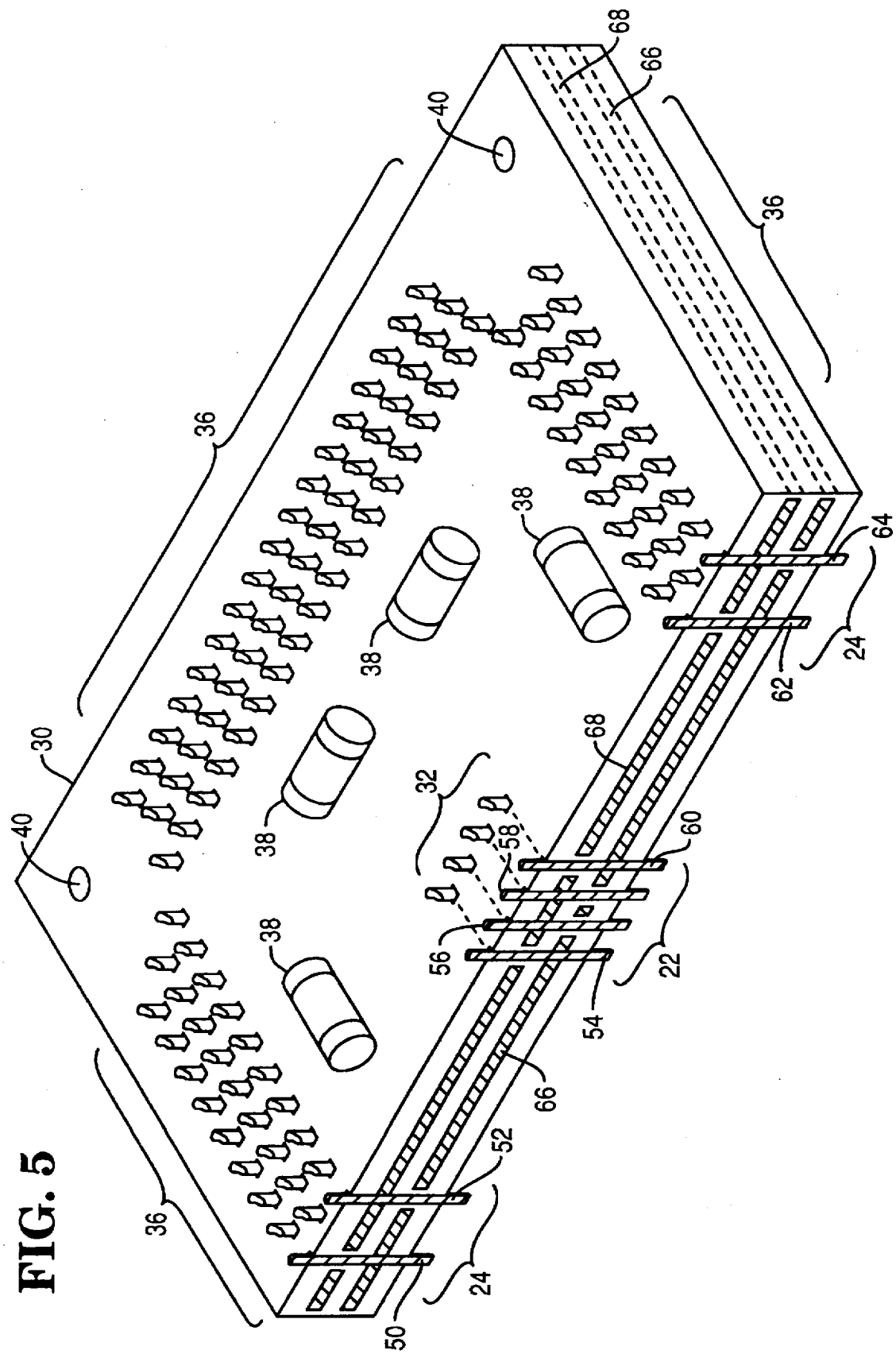
FIG. 5 is a cut-away view of a power interface adapter.

FIG. 3 shows a top level view of the power interface adapter 30 of the present invention. This power interface adapter (PIA) is fabricated using a double-sided printed circuit board. However, as shown in FIG. 5, the PIA 30 may also be fabricated as a multi-layer PCB. The additional internal voltage planes allow for distribution of multiple supply voltages as required per the device specification. PCB length, width and material thickness dimensions will vary with the type of device socket 14, with the length and width dimensions generally being approximately equal to the length and width of the particular device socket, and the material thickness dimension to be determined based on the length of the device socket pins. The PIA has a central region, indicated at 32, which comprises a plurality of plated conduits 34 through which the power interconnect pins 22 pass (as shown in FIG. 4). The PIA also has a plurality of socket interface regions 36 around its periphery. These regions 36 have a plurality of plated conduits 42 through which socket pins 24 pass. In addition, the PIA has a plurality of de-coupling capacitors 38 soldered thereon. These de-coupling capacitors provide supply voltage noise filtering for the integrated circuit package 20. The use of the PIA PCB provides a platform which enables de-coupling capacitors to be located proximate to the device socket 14 power pins of the integrated circuit 20. This method of capacitor de-coupling for Universal burn-in board designs results in a marked improvement over existing supply voltage de-coupling techniques. Finally, the PIA has mounting holes 40 at each corner, for mechanically mounting the PIA to the burn-in board sub-system.

Referring now to FIG. 4, the completed burn-in board assembly is shown for a single device socket location. It should be understood that there are a plurality of PIA 30 printed circuit boards used in conjunction with a single BIB, with each PIA being located at a particular device socket 14 location shown in FIG. 1. Continuing with FIG. 4, the PIA 30 connects to the device socket pins 24 and power interconnect pins 22 located on the solder side of the burn-in board 12. The PIA slips over the plurality of pins 24 and 22, with these pins passing through plated conduits located within regions 32 and 36 of the PIA (such regions being shown in FIG. 3). The power interconnect pins 22 and device socket pins 24 are preferably soldered to the PIA 30, although other methods of electrical interconnection are possible. An optional nylon spacer 44 mechanically separates the PIA 30 from the burn-in board 12. A hinged or snap-in socket cap 46 may optionally be included on top of the device socket 14. This socket cap is opened by lifting up lip 48 in order to insert an electrical component or integrated circuit device 20 (shown in phantom as inside the socket cap 46).

As previously described, supply voltages are connected from the edge connector 10 of the burn-in board 12 to power interconnect pins 22. Power transfer to the PIA is accomplished via these multiple power interconnect pins 22, which provide VDD and VSS voltage connections to the power planes of the PIA (other additional voltages could similarly be provided to additional power planes in a multi-layer PCB). These voltage planes allow for distribution of the respective voltages to the required device socket pins 24.

As shown in FIG. 5, a PIA similar to the one in FIG. 3 has been cut away. The thickness of the PIA in FIG. 5 has been exaggerated to better show the internal voltage planes of the PIA. Power interconnect pins 22, which are centrally located at 32 on the top surface of PIA 30, receive supply voltages from the burn-in board. In the example shown, a first supply voltage VDD is connected from pins 54 and 60 down into an internal voltage plane 66 of the PIA. Similarly, a second supply voltage VSS is connected from pins 56 and 58 down into an internal voltage plane 68 of the PIA. Internal voltage plane 66 is connected to device socket pins 50 and 62, and internal voltage plane 68 is connected to device socket pins 52 and 64. As can be seen, internal vias known in the art isolate pins 52, 56, 58, and 64 from the first internal voltage plane 66. Similarly, internal vias isolate pins 50, 54, 60 and 62 from the second internal voltage plane 68.

As previously shown with respect to FIG. 2, device socket pins 24 are electrically connected to device 20. Thus, device socket pins 50 and 62 provide a first supply voltage such as VDD to device 20 via socket 14, and socket pins 52 and 64 provide a second supply voltage such as VSS to device 20 via device socket 14. The remaining socket pins 36, depending on the actual device 20 to be burned-in, could either be signal pins for input and output signals to the device 20, or they could be connected to one or more of the other power interconnect pins 22 within area 32 of FIG. 5.

Figure 6:
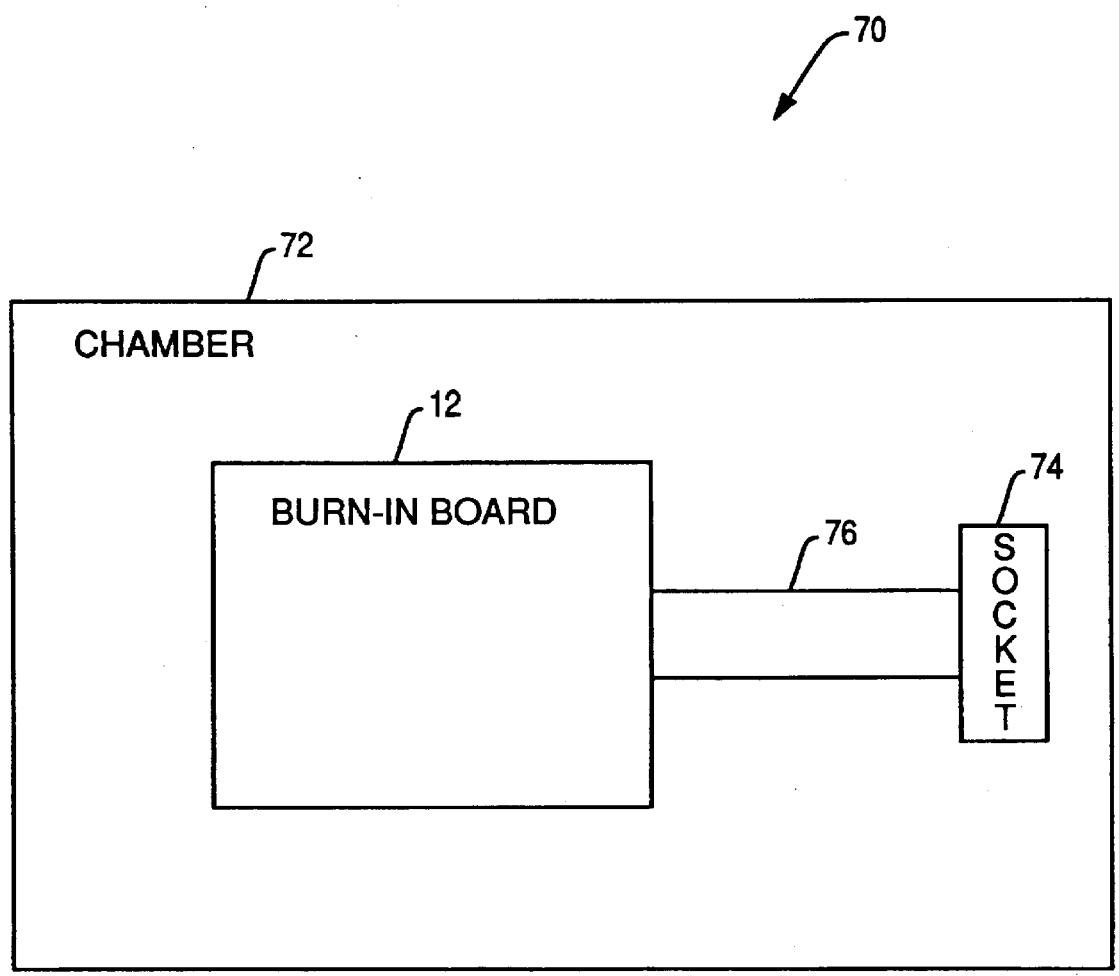
FIG. 6 shows a burn-in system.

FIG. 6 shows the overall burn-in system 70, with an environmental chamber 72 having a burn-in socket 74. A cable 76 is coupled between the burn-in socket and burn-in board. The burn-in board is placed in the environmental chamber in order to subject the electrical devices on the burn-in board to environmental stress.

In summary, a power supply voltage (as originally provided by a burn-in fixture) travels from the burn-in board edge connector 10, via a wiring conductor on the burn-in board 12, to a power interconnect pin 22. This voltage on the power interconnect pin 22 is connected to the PIA at the point where the power interconnect pin passes through plated conduit 34 of the PIA. The PIA connects the particular supply voltage that exists on the interconnect pin 22, via a power plane, to the desired socket pin 24. This socket pin, which is electrically connected to the device socket 14, provides the supply voltage to the device 20 being burned-in.

As noted above, the PIA routes supply voltages received from the power interconnect pins 22 to particular socket pins 24, as dictated by the location of the power pins for a particular device 14. If a different type or family of device has different locations for its power pins, then a different PIA would be required, with the PIA printed circuit board being fabricated to route the respective voltages to the appropriate power pins for the particular type or family of device. The particular PIA configuration of FIG. 5 is but one of many possible supply voltage routing configurations. The requirements for the particular voltage supply routing, and the number of internal voltage planes needed for the PIA, are dictated by the particular device specification.

If a burn-in board is to contain only a single type or family of device, where each device on the board has the same power pin locations, it is also possible to have a single, large PIA that is wired to route power for each of the devices. It would also be possible to have a PIA board that provides power supply voltage routing to a plurality of dissimilar types of devices. However, this is not the preferred method or system, due to the PIA's highly customized nature (and hence limited reusability when other types/configurations of devices are to burned-in).

It should also be noted that the techniques described herein are particularly well suited for devices which have a large number of power pins. The larger the number of individual power pins in a device package, the greater the savings in the reduction of manual set-up for power harness interconnect, as is required by existing burn-in board techniques.

While I have illustrated and described the preferred embodiment of my invention, it is to be understood that I do not limit myself to the precise constructions herein disclosed, and the right is reserved to all changes and modifications coming within the scope of the invention as defined in the appended claims.

I claim:

1. An electrical distribution system, comprising:

a burn-in board having first local conductors, first protruding conductors and first vias;

a printed circuit board, connected to at least one of the first protruding conductors, having second local conductors and second vias; and at least one device having second protruding conductors which pass through at least some of the first vias and second vias, wherein the first local conductors couple at least one stimulus signal to the at least one device and the second local conductors couple at least one supply voltage to the at least one device.

2. The distribution system of claim 1 wherein the device is a socket.

3. The distribution system of claim 1 wherein an integration circuit package is coupled to the device.

4. The distribution system of claim 1 wherein the device is an integrated circuit package.

* * * * *